United States Patent
Chuang et al.

(10) Patent No.: US 6,493,225 B2
(45) Date of Patent: Dec. 10, 2002

(54) HEAT-DISSIPATING ASSEMBLY

(75) Inventors: Te-Tsai Chuang, Taoyuan Shien (TW); Kuo-Cheng Lin, Taoyuan Shien (TW); Wen-Shi Huang, Taoyuan Shien (TW)

(73) Assignee: Delta Electronics, Inc., Taoyuan Shien (TW)

( * ) Notice: Subject to any disclaimer, the term of this patent is extended or adjusted under 35 U.S.C. 154(b) by 0 days.

(21) Appl. No.: 09/918,034

(22) Filed: Jul. 30, 2001

(65) Prior Publication Data

US 2002/0067597 A1 Jun. 6, 2002

(30) Foreign Application Priority Data

Dec. 6, 2000 (TW) ........................................ 89221200 U

(51) Int. Cl.[7] ................................................. H05K 7/20
(52) U.S. Cl. ........................ 361/695; 361/697; 415/176; 415/177; 415/178
(58) Field of Search ................................. 361/679–690, 361/694, 695, 704, 823, 824; 174/16.1, 16.3; 165/80.3, 104.33, 185; 454/184

(56) References Cited

U.S. PATENT DOCUMENTS

| | | | | |
|---|---|---|---|---|
| 5,615,998 A | * | 4/1997 | Kodama et al. | 415/177 |
| 5,788,566 A | * | 8/1998 | McAnally et al. | 454/184 |
| 5,969,941 A | * | 10/1999 | Cho | 361/687 |
| 6,042,474 A | * | 3/2000 | Harvey et al. | 454/184 |
| 6,186,889 B1 | * | 2/2001 | Byrne | 454/184 |
| 6,244,953 B1 | * | 6/2001 | Dugan et al. | 454/184 |
| 6,373,698 B1 | * | 4/2002 | Christensen | 361/695 |
| 6,375,440 B2 | * | 4/2002 | Kosugi | 417/423.14 |

* cited by examiner

*Primary Examiner*—Boris Chervinsky
(74) *Attorney, Agent, or Firm*—Volpe and Koenig, P.C.

(57) ABSTRACT

A heat-dissipating assembly for being used in a system frame is provided. The heat-dissipating assembly includes a heat-dissipating device having a plurality of holes thereon, and a securing device engaged with the system frame and having a plurality of engaging elements corresponding to the plurality of holes of the heat-dissipating device for separately connecting the heat-dissipating device with the securing device, and a plurality of supporting flanges for assisting in securing the heat-dissipating device to the securing device.

13 Claims, 3 Drawing Sheets

HEAT-DISSIPATING ASSEMBLY

FIELD OF THE INVENTION

The present invention relates to a heat-dissipating assembly, and more particularly to a heat-dissipating assembly for being used in a system frame.

BACKGROUND OF THE INVENTION

The heat-dissipation is always the essential problem in application of electric products. A good heat-dissipating mechanism usually represents a stable performance of the electric device. On the other hand, an electric device operated under an abnormal-dissipating condition will inevitably lead to an unstable performance and reduce the operation life of the electric device.

Currently, many high-level electric appliances have heat-dissipating devices that are hot swappable. When the heat-dissipating device is malfunctioned in operation, the heat-dissipating device itself could be online replaced without turning off the electric appliance. For example, a hot swappable heat-dissipating device is widely used to a server of a computer system.

FIG. 1 is a schematic view of a conventional heat-dissipating device 11. The heat-dissipating device 11 has a first terminal connector 18 for connecting with a second terminal connector (not shown) of a system frame when the heat dissipating device 11 is placed into the system frame. In addition, the heat-dissipating device 11 is engaged with a securing seat 13, and fasteners 15 are fastened to a first aperture 16 of the securing seat 13 and a second aperture 14 of the heat-dissipating device 11.

When the heat-dissipating device 11 is malfunctioned in operation, the heat-dissipating device 11 could be disassembled and replaced without turning off the system. However, replacing such heat-dissipating assembly is costly and time-consuming because the heat-dissipating device 11 together with the securing seat 13 and the terminal connector 17 need to be replaced.

In order to overcome drawbacks described above, the present invention provides a heat-dissipating assembly for overcoming the drawbacks described above.

SUMMARY OF THE INVENTION

It is therefore an object of the present invention to provide a heat-dissipating assembly for being used in a system frame.

In accordance with the present invention, the heat-dissipating assembly includes a heat-dissipating device having a plurality of holes thereon, and a securing device engaged with the system frame and having a plurality of engaging elements corresponding to the plurality of holes of the heat-dissipating device for separately connecting the heat-dissipating device with the securing device, and a plurality of supporting flanges for assisting in securing the heat-dissipating device to the securing device.

Certainly, the heat-dissipating device could be a fan.

Preferably, the securing device is L-shaped.

In addition, the securing device further includes a retractable terminal receiver for receiving a terminal of the heat-dissipating device when the heat-dissipating device is connected with the securing device. The securing device further has a receptacle for receiving the terminal receiver, and a resilient arm having a slot thereon and disposed adjacent to the receptacle for supporting the terminal receiver received in the receptacle of the securing device.

Furthermore, the terminal receiver has a salient for plugging into the slot of the resilient arm.

It is another object of the present invention to provide a heat-dissipating assembly for being used in a system frame.

In accordance with the present invention, the heat-dissipating assembly includes a heat-dissipating device having at least one terminal thereon, and a securing device engaged with the system frame and having a retractable terminal receiver for receiving the at least one terminal of the heat-dissipating device to conduct electricity.

Preferably, the securing device is L-shaped.

Certainly, the heat-dissipating device could be a fan.

In accordance with the present invention, the securing device further has a receptacle for receiving the terminal receiver, and a resilient arm having a slot thereon and disposed adjacent to the receptacle for supporting the terminal receiver received in the receptacle of the securing device.

In addition, the terminal receiver has a salient for plugging into the slot of the resilient arm.

Furthermore, the heat-dissipating device further has a plurality of holes and the securing device further has a plurality of engaging elements corresponding to the plurality of holes for assisting in securing the heat-dissipating device to the securing device.

It is another object of the present invention to provide a securing device for being used in a system frame and engaging with a heat-dissipating device having a plurality of holes thereon.

In accordance with the present invention, the securing device includes a plurality of engaging elements corresponding to the plurality of holes of the heat-dissipating device for separately connecting the heat-dissipating device with the securing device, and a plurality of supporting flanges for assisting in securing the heat-dissipating device to the securing device.

Preferably, the securing device is L-shaped.

Certainly, the heat-dissipating device could be a fan.

In addition, the securing device further includes a retractable terminal receiver for receiving a terminal of the heat-dissipating device when the heat-dissipating device is connected with the securing device.

In addition, the securing device further has a receptacle for receiving the terminal receiver, and a resilient arm having a slot thereon and disposed adjacent to the receptacle for supporting the terminal receiver received in the receptacle of the securing device.

Furthermore, the terminal receiver has a salient for plugging into the slot of the resilient arm.

The present invention may best be understood through the following descriptions with reference to the accompanying drawings, in which:

DETAILED DESCRIPTION OF THE PREFERRED EMBODIMENTS

Figure 1:
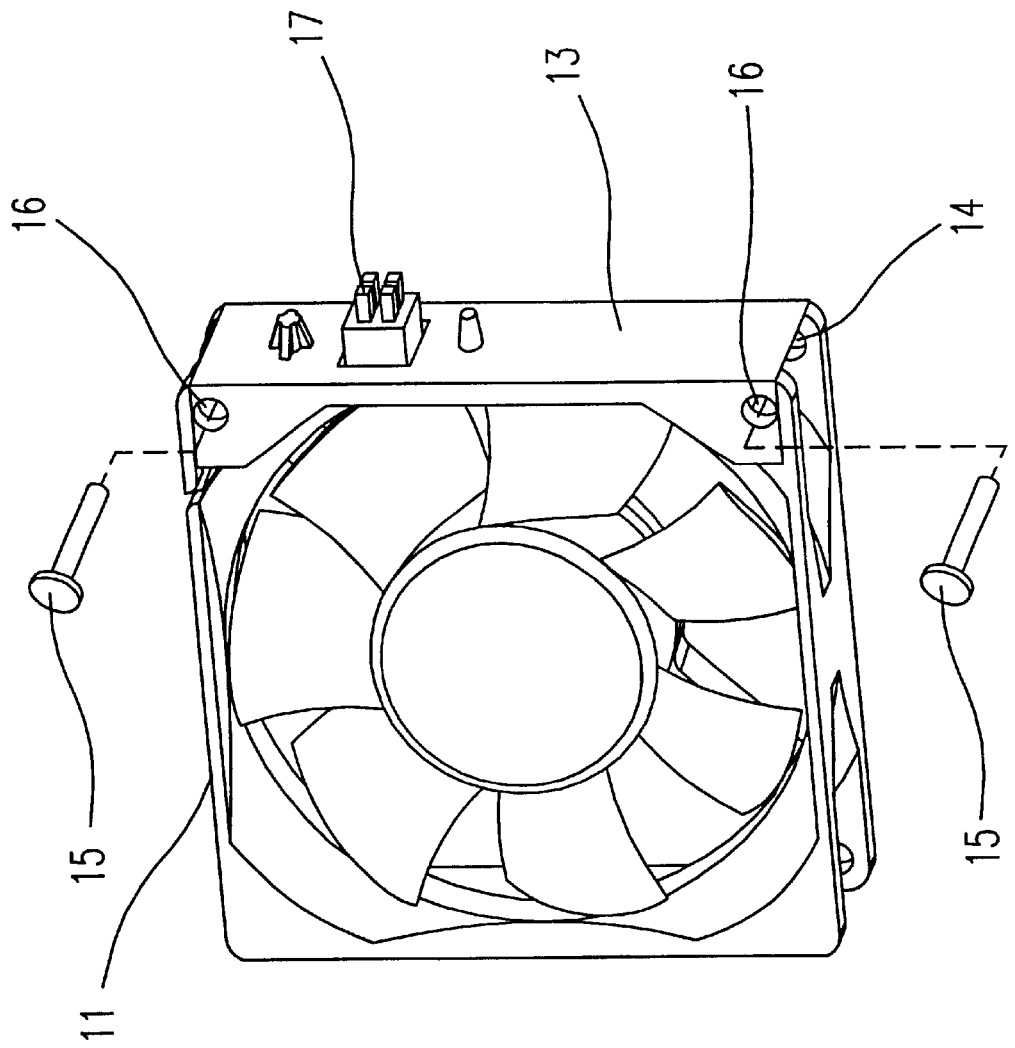
FIG. 1 is a schematic view illustrating the heat-dissipating device according to the prior art.
Figure 2:
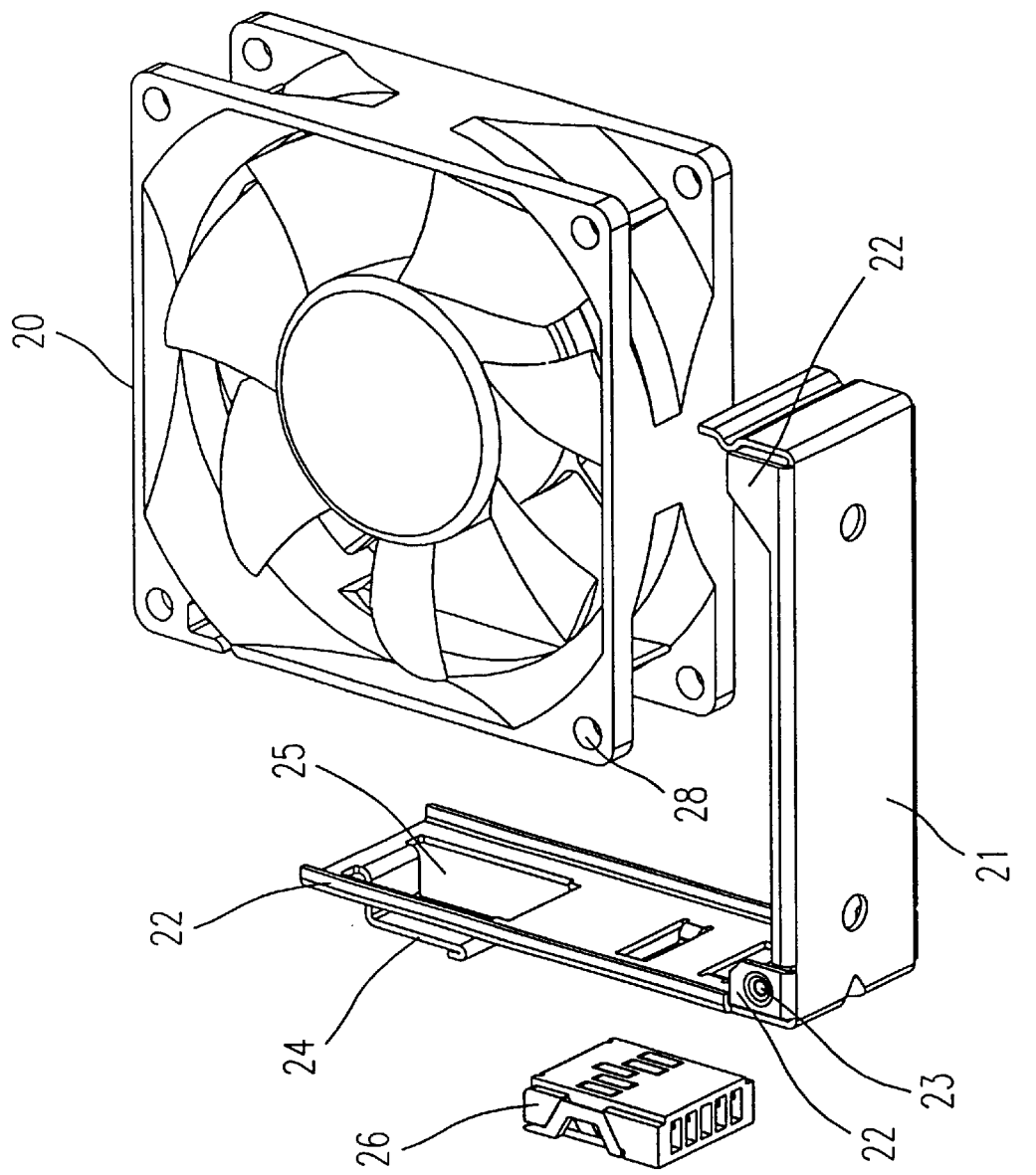
FIG. 2 is a schematic view illustrating the elements of the heat-dissipating assembly according to the preferred embodiment of the present invention.

Please refer to FIG. 2. The elements of the heat-dissipating assembly according to the preferred embodiment of the present invention are illustrated. A heat-dissipating device 20, for example a fan, is inserted into an L-shaped securing device 21 along a passage formed by rims 22 of the securing device 21. Subsequently, engaging elements 23 of the securing device 21 are wedged into corresponding holes 28 of the heat-dissipating device 20, and then the heat-dissipating device 20 is secured to the securing device 21. In addition, a receptacle 25 and a resilient arm 24 disposed on one side of the securing device are designed for receiving a retractable terminal receiver 26. The terminal receiver 26 is used for receiving at least one terminal of the heat-dissipating device 20 to conduct electricity when the heat-dissipating device 20 is connected with the securing device 21. Certainly, the securing device 21 is installed in a system frame (not shown).

Figure 3:
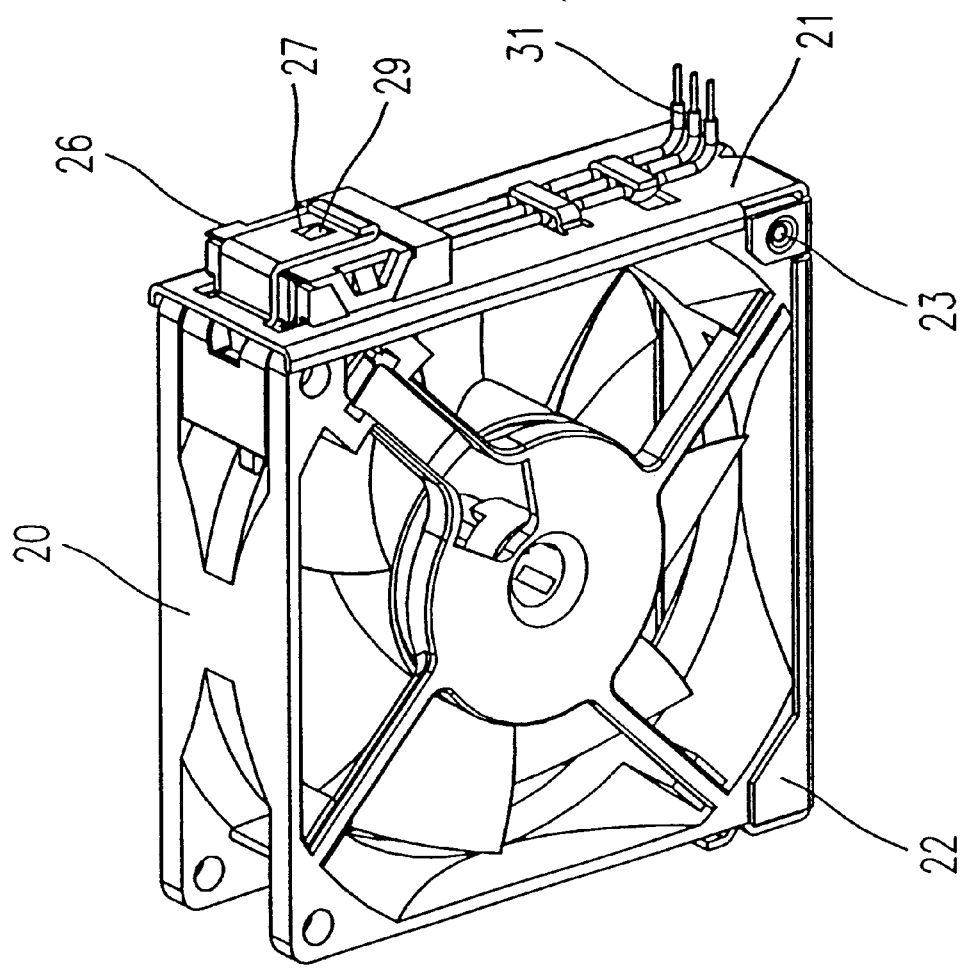
FIG. 3 is a schematic view showing the heat-dissipating assembly according to the preferred embodiment of the present invention.

As shown in FIG. 3, the heat-dissipating device 20 and the securing device 21 are assembled to form the heat-dissipating assembly according to the preferred embodiment of the present invention. The heat-dissipating device 20 connected with the securing device 21 is secured by the engaging elements 23 and the rims 22 of the securing device 21. Certainly, the engaging elements 23 could be resilient tenons. In addition, conducting wires 31 could be pulled from the terminal receiver 26 to the interior of the system. Certainly, the heat-dissipating device 20 could be easily drawn out of the heat-dissipating assembly.

The resilient arm 24 has a slot 27 thereon for receiving a salient 29 of the terminal receiver 26 and tightly securing the terminal receiver 26 when the heat-dissipating device 20 is connected with the securing device 21.

According to the present invention, the heat-dissipating device is well secured to the securing device when the engaging elements of the securing device is wedged into the corresponding holes of the heat-dissipating device. Because the heat-dissipating device is not secured to the securing device by fasteners, the heat-dissipating device is easily drawn out from the securing device. Certainly, the heat-dissipating device is hot swappable. Furthermore, if the heat-dissipating device is out of function, only the heat-dissipating device itself needs to be replaced, which saves cost.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures. Therefore, the above description and illustration should not be taken as limiting the scope of the present invention which is defined by the appended claims.

What is claimed is:

1. A heat-dissipating assembly for being used in a system frame, comprising:

a heat-dissipating device having a plurality of holes thereon; and a securing device engaged with said system frame comprising:

a plurality of engaging elements corresponding to said plurality of holes of said heat-dissipating device for separately connecting said heat-dissipating device with said securing device;

a plurality of supporting rims for assisting in securing said heat-dissipating device to said securing device;

a retractable terminal receiver for receiving a terminal of said heat-dissipating device when said heat-dissipating device is connected with said securing device;

a receptacle for receiving said terminal receiver; and a resilient arm having a slot thereon and disposed adjacent to said receptacle for supporting said terminal receiver received in said receptacle of said securing device.

2. The heat-dissipating assembly according to claim 1, wherein said heat-dissipating device is a fan.

3. The heat-dissipating assembly according to claim 1, wherein said securing device is L-shaped.

4. The heat-dissipating assembly according to claim 1, wherein said terminal receiver has a salient for plugging into said slot of said resilient arm.

5. A heat-dissipating assembly for being used in a system frame, comprising:

a heat-dissipating device having at least one terminal thereon; and a securing device engaged with said system frame comprising:

a retractable terminal receiver for receiving said at least one terminal of said heat-dissipating device to conduct electricity;

a receptacle for receiving said terminal receiver; and a resilient arm having a slot thereon and disposed adjacent to said receptacle for supporting said terminal receiver received in said receptacle of said securing device.

6. The heat-dissipating assembly according to claim 5, wherein said securing device is L-shaped.

7. The heat-dissipating assembly according to claim 5, wherein said heat-dissipating device is a fan.

8. The heat-dissipating assembly according to claim 5, wherein said terminal receiver has a salient for plugging into said slot of said resilient arm.

9. The heat-dissipating assembly according to claim 5, wherein said heat-dissipating device further has a plurality of holes and said securing device further has a plurality of engaging elements corresponding to said plurality of holes for assisting in securing said heat-dissipating device to said securing device.

10. A securing device for being used in a system frame, and engaging with a heat-dissipating device having a plurality of holes thereon, comprising:

a plurality of engaging elements corresponding to said plurality of holes of said heat-dissipating device for separately connecting said heat-dissipating device with said securing device;

a plurality of supporting rims for assisting in securing said heat-dissipating device to said securing device;

a retractable terminal receiver for receiving a terminal of said heat-dissipating device when said heat-dissipating device is connected with said securing device;

a receptacle for receiving said terminal receiver; and a resilient arm having a slot thereon and disposed adjacent to said receptacle for supporting said terminal receiver received in said receptacle of said securing device.

11. The securing device according to claim 10, wherein said securing device is L-shaped.

12. The securing device according to claim 10, wherein said heat-dissipating device is a fan.

13. The securing device according to claim 10, wherein said terminal receiver has a salient for plugging into said slot of said resilient arm.

* * * * *